(12) United States Patent
Lin et al.

(10) Patent No.: US 9,299,699 B2
(45) Date of Patent: Mar. 29, 2016

(54) MULTI-GATE AND COMPLEMENTARY VARACTORS IN FINFET PROCESS

(71) Applicant: Taiwan Semiconductor Manufacturing Company, Ltd., Hsin-Chu (TW)

(72) Inventors: Chi-Hsien Lin, Taichung (TW);
Ying-Ta Lu, Fanlu Township (TW);
Hsien-Yuan Liao, Huatan Township (TW); Ho-Hsiang Chen, Hsin-Chu (TW); Chewn-Pu Jou, Hsin-Chu (TW);
Fu-Lung Hsueh, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 73 days.

(21) Appl. No.: 13/801,089

(22) Filed: Mar. 13, 2013

(65) Prior Publication Data

US 2014/0264628 A1     Sep. 18, 2014

(51) Int. Cl.
*H01L 27/088* (2006.01)
*H01L 27/08* (2006.01)

(52) U.S. Cl.
CPC ........ *H01L 27/0886* (2013.01); *H01L 27/0808* (2013.01)

(58) Field of Classification Search
CPC .................................................. H01L 27/0886
See application file for complete search history.

(56) References Cited

U.S. PATENT DOCUMENTS

| | | | |
|---|---|---|---|
| 6,100,770 A | 8/2000 | Litwin et al. | |
| 6,407,412 B1 | 6/2002 | Iniewski et al. | |
| 8,735,993 B2 * | 5/2014 | Lo | H01L 27/0255 257/347 |
| 2002/0036290 A1 | 3/2002 | Inaba et al. | |
| 2003/0136992 A1 | 7/2003 | Adan | |
| 2006/0084211 A1* | 4/2006 | Yang | H01L 29/66795 438/197 |
| 2009/0309162 A1 | 12/2009 | Baumgartner et al. | |
| 2013/0309832 A1* | 11/2013 | Cheng | H01L 21/84 438/381 |
| 2014/0167172 A1* | 6/2014 | Chen et al. | 257/368 |

FOREIGN PATENT DOCUMENTS

| | | |
|---|---|---|
| JP | 2002110963 | 4/2002 |
| JP | 2010034266 | 2/2010 |
| KR | 20010023918 | 3/2001 |
| WO | 9913514 | 3/1999 |

OTHER PUBLICATIONS

Svelto, F., et al., "A Three Terminal Varactor for RF IC's in Standard CMOS Technology," IEEE Transactions on Electron Devices, vol. 47, No. 4, Apr. 2000, pp. 893-895.

Wong, Wallace Ming Yip, et al., "A Wide Tuning Range Gated Varactor," IEEE Journal of Solid-State Circuits, vol. 35, No. 5, May 2000, pp. 773-779.

* cited by examiner

*Primary Examiner* — Bilkis Jahan
(74) *Attorney, Agent, or Firm* — Slater & Matsil, L.L.P.

(57) ABSTRACT

A varactor includes at least one semiconductor fin, a first gate, and a second gate physically disconnected from the first gate. The first gate and the second gate form a first FinFET and a second FinFET, respectively, with the at least one semiconductor fin. The source and drain regions of the first FinFET and the second FinFET are interconnected to form the varactor.

17 Claims, 14 Drawing Sheets

US 9,299,699 B2

MULTI-GATE AND COMPLEMENTARY VARACTORS IN FINFET PROCESS

BACKGROUND

Varactors are commonly used in various applications that require capacitors with variable capacitance values. Varactors are capacitors whole capacitance values change with the voltages applied on the capacitors. For example, in Voltage Controlled Oscillators (VCOs), varactors are widely used.

Varactors are commonly formed using Metal-Oxide-Semiconductor (MOS) devices. In a typical varactor, a gate of a MOS device is used as one capacitor plate of the varactor, and the source and drain of the MOS device are interconnected to form another capacitor plate of the varactor. The gate dielectric acts as the capacitor insulator. In the VCOs, low sensitivity and low KVCO (the gains of the VCOs) are typically needed, wherein the sensitivity is the ratio of the capacitance change to the change of the bias voltage applied on the gate.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A varactor and the method of forming the same are provided in accordance with various exemplary embodiments. The variations and the operation of the embodiments are discussed. Throughout the various views and illustrative embodiments, like reference numbers are used to designate like elements.

Figure 1A:
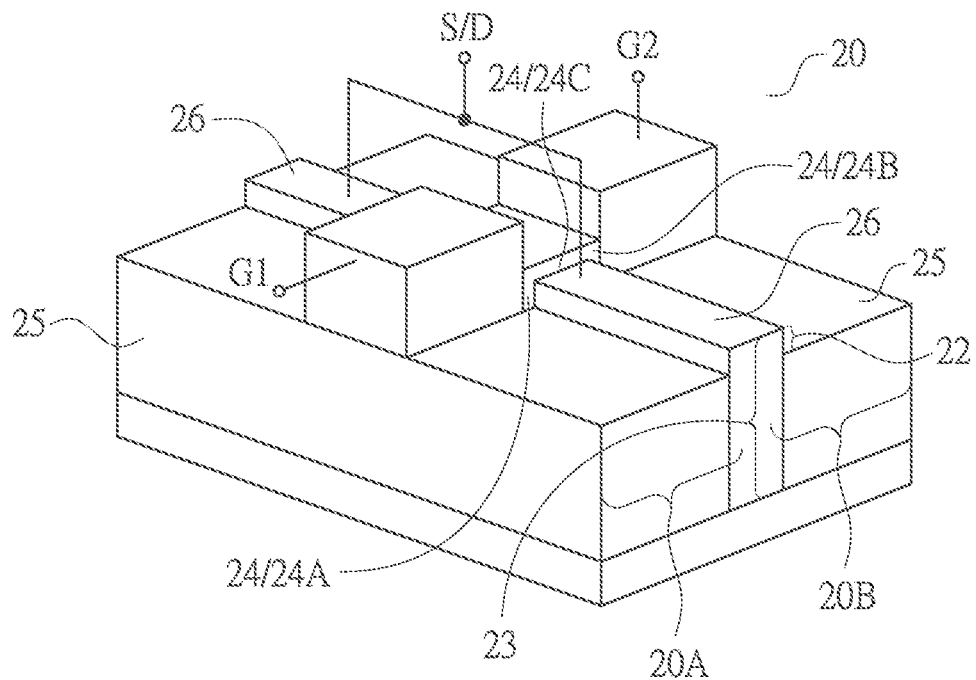
FIGS. 1A, 1B, 1C, and 1D illustrate a perspective view and symbols of a varactor in accordance with some embodiments.

FIG. 1A illustrates a perspective view of exemplary varactor 20. In accordance with some embodiments, varactor 20 is formed based on a Fin Field-Effect Transistor (FinFET) structure, which includes semiconductor fin 22. Fin 22 may be a top portion of semiconductor strip 23, which is between opposite Shallow Trench Isolation (STI) regions 25. Furthermore, semiconductor fin 22 is over the top surfaces of STI regions 25. Gate dielectric 24 includes portions 24A and 24B, which are on the opposite sidewalls of fin 22. Gate dielectric 24 may also include portion 24C on a top surface of fin 22. A portion of fin 22 overlapped by gate dielectric 24 forms the channel of the FinFET. Source and drain regions 26 are formed on the opposite sides of the channel, wherein one of the source and drain regions 26 is a source region, and the other one of source and drain regions 26 is a drain region. Throughout the description, the symbol "S/D" (as shown in FIG. 1A) is used to indicate that the respective connected regions include a source region and a drain region.

Varactor 20 includes gates G1 and G2. Gates G1 and G2 are physically separated from each other, and are electrically disconnected from each other. Accordingly, different voltages may be applied on gates G1 and G2 at the same time. In accordance with some embodiments, gates G1 and G2 are formed by forming a continuous gate, and etching a portion of the continuous gate directly over gate dielectric 24. The sidewalls of gates G1 and G2 contact gate dielectric portions 24A and 24B, respectively. Gate G1 forms first FinFET 20A with fin 22, wherein sidewall portion 24A of gate dielectric 24 acts as the gate dielectric of the first FinFET 20A, and source and drain regions 26 act as the source and drain regions of the first FinFET 20A. Gate G2 forms second FinFET 20B with fin 22, wherein sidewall portion 24B of gate dielectric 24 acts as the gate dielectric of the second FinFET 20B, and source and drain regions 26 also act as the source and drain regions of the second FinFET 20B. In some embodiments, gates G1 and G2 do not include portions overlapping gate dielectric portion 24C, and hence the first FinFET 20A and the second FinFET 20B are formed with the sidewalls portions of gate dielectric 24, but not with top portion 24C. In alternative embodiments, one or both gates G1 and G2 extend overlapping gate dielectric portion 24C, and hence first FinFET 20A and second FinFET 20B are also formed with the top portion 24C of gate dielectric 24 in addition to the sidewall portions.

The source and drain regions 26 are interconnected, for example, through contact plugs and metal lines in the overlying metal layers. The respective node is also denoted as "S/D." Hence, FinFET 20A forms a first varactor, and FinFET 20B forms a second varactor. The first and the second varactors are connected in parallel to form varactor 20.

Figure 1B:
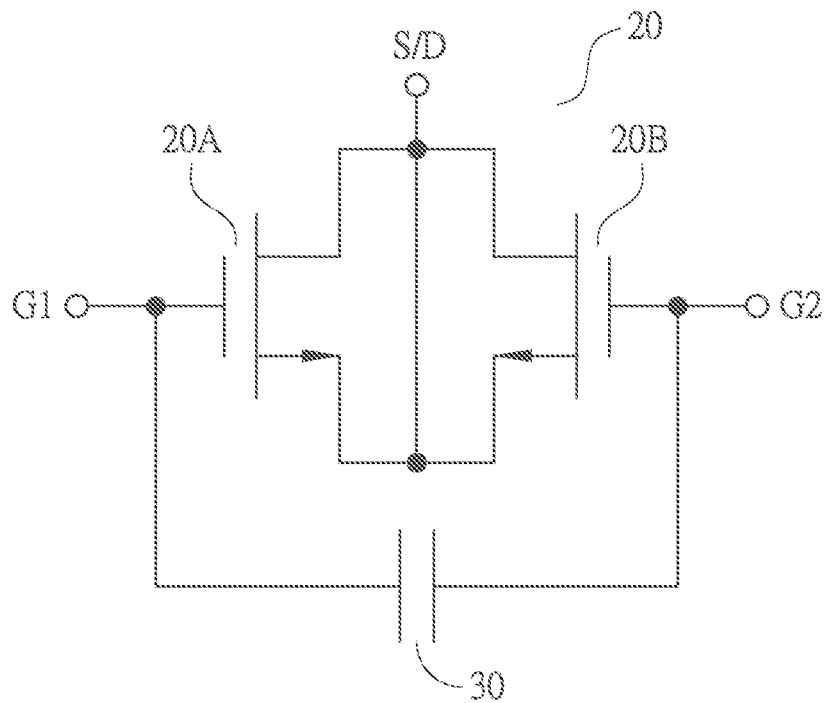
Figure 1C:
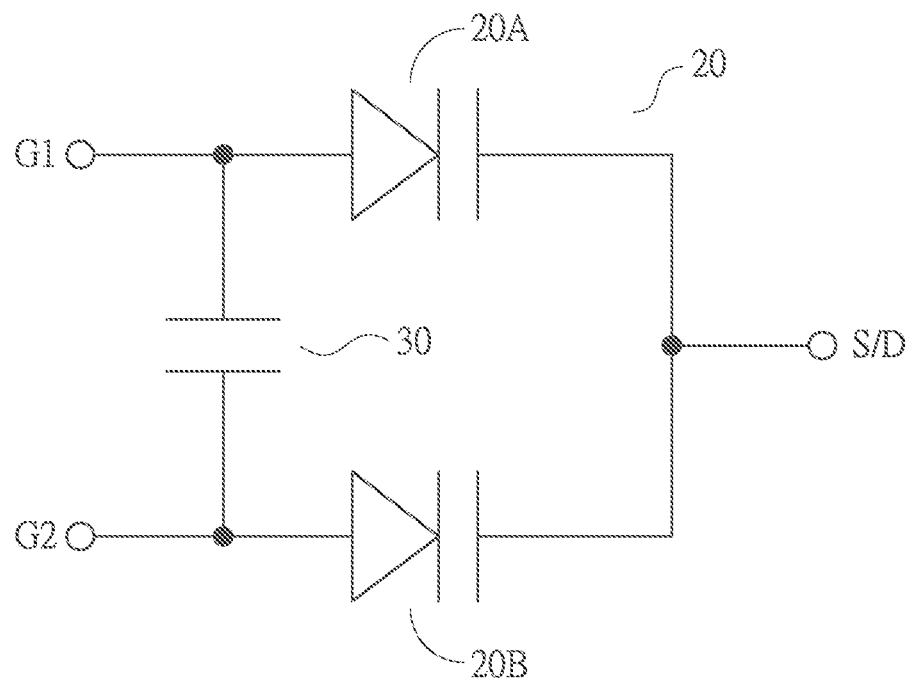
Figure 1D:
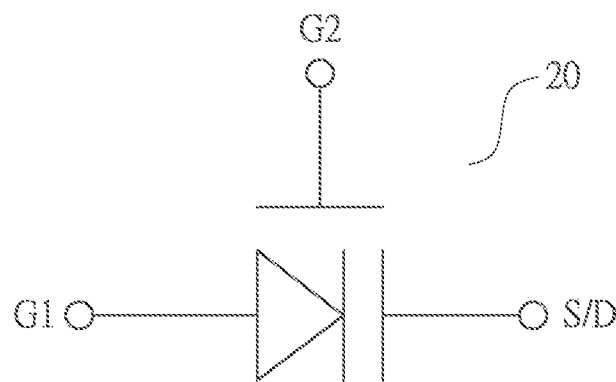

FIG. 1B illustrates an equivalent circuit diagram of varactor 20, wherein the first FinFET 20A and second FinFET 20B are illustrated as being connected in parallel. Capacitor 30 is the parasitic capacitor between gates G1 and G2. In FIG. 1C, FinFETs 20A and 20B are represented by the symbols of varactor 20A and 20B. In FIG. 1D, the symbol of varactor 20 is illustrated, which is a three-terminal varactor, with gates G1 and G2 and source/drain S/D act as the three terminals.

Figure 1E:
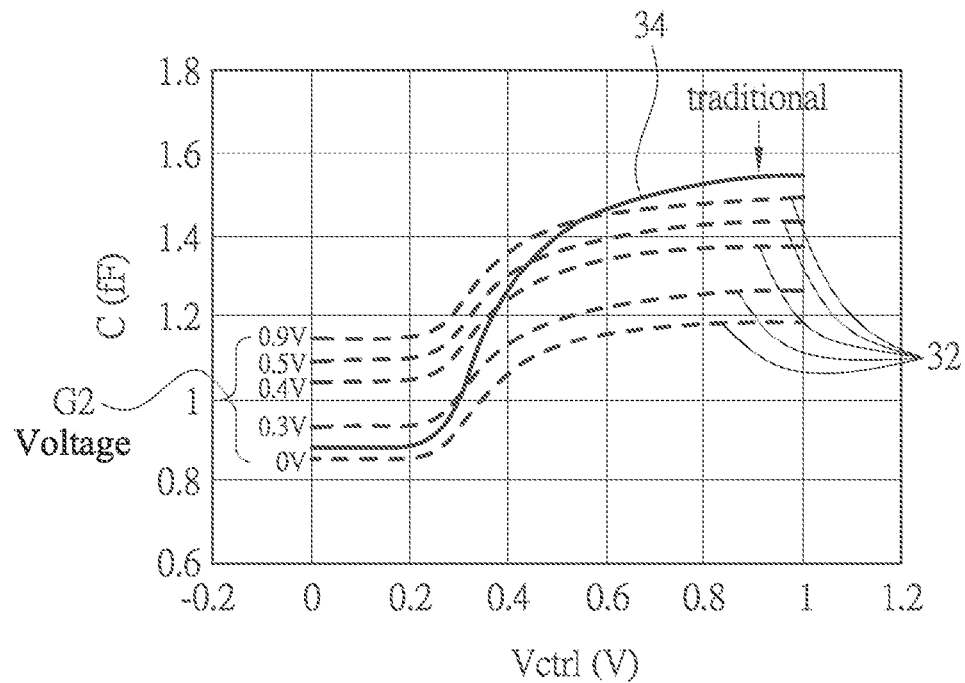
FIG. 1E illustrates C-V curves of a varactor in accordance with exemplary embodiments, wherein the C-V curves are compared to a C-V curve of a conventional varactor.

FIG. 1E illustrates Capacitor-Voltage (C-V) curves 32 of varactor 20 (FIG. 1A), wherein the capacitance of varactor 20 is illustrated as a function of gate voltage Vctrl, which is the voltage applied on gate G1. A plurality of lines 32 are illustrated, wherein each of lines 32 is obtained by applying a voltage on gate G2. It is observed that when different voltages are applied on gate G2, the resulting C-V curves 32 are different from each other, and the higher the voltage on gate G2, the greater capacitance varactor 20 will have. FIG. 1E also illustrates line 34, which is obtained from a conventional two-terminal varactor comprising a single gate, on which voltage Vctrl is applied. By comparing lines 32 with line 34, it is observed that line 34 is steeper, indicating that the capacitance sensitivity of lines 32 are lower, wherein the capacitance sensitivity is the ratio of the change in capacitance to the change in gate voltage. Accordingly, the embodiments of the present disclosure have smaller capacitance sensitivities than conventional varactors.

Figure 2A:
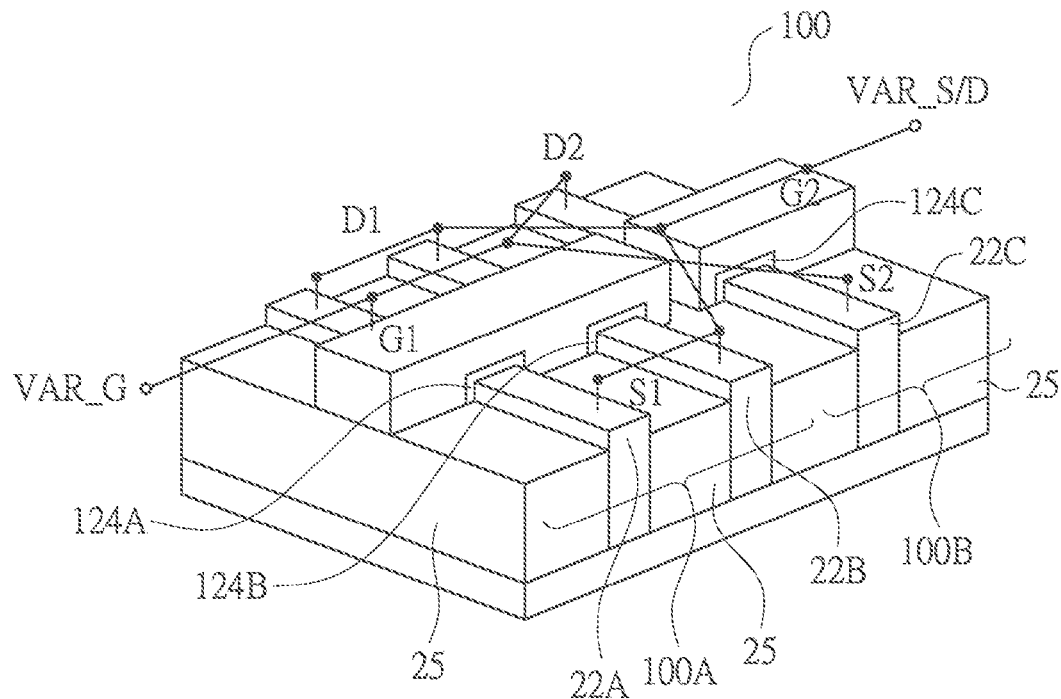
FIGS. 2A and 2B illustrate a perspective view and a top view, respectively, of a varactor in accordance with some embodiments, wherein the varactor includes two varactors, with the gates and the source/drain regions of the two varactors cross-connected.
Figure 2B:
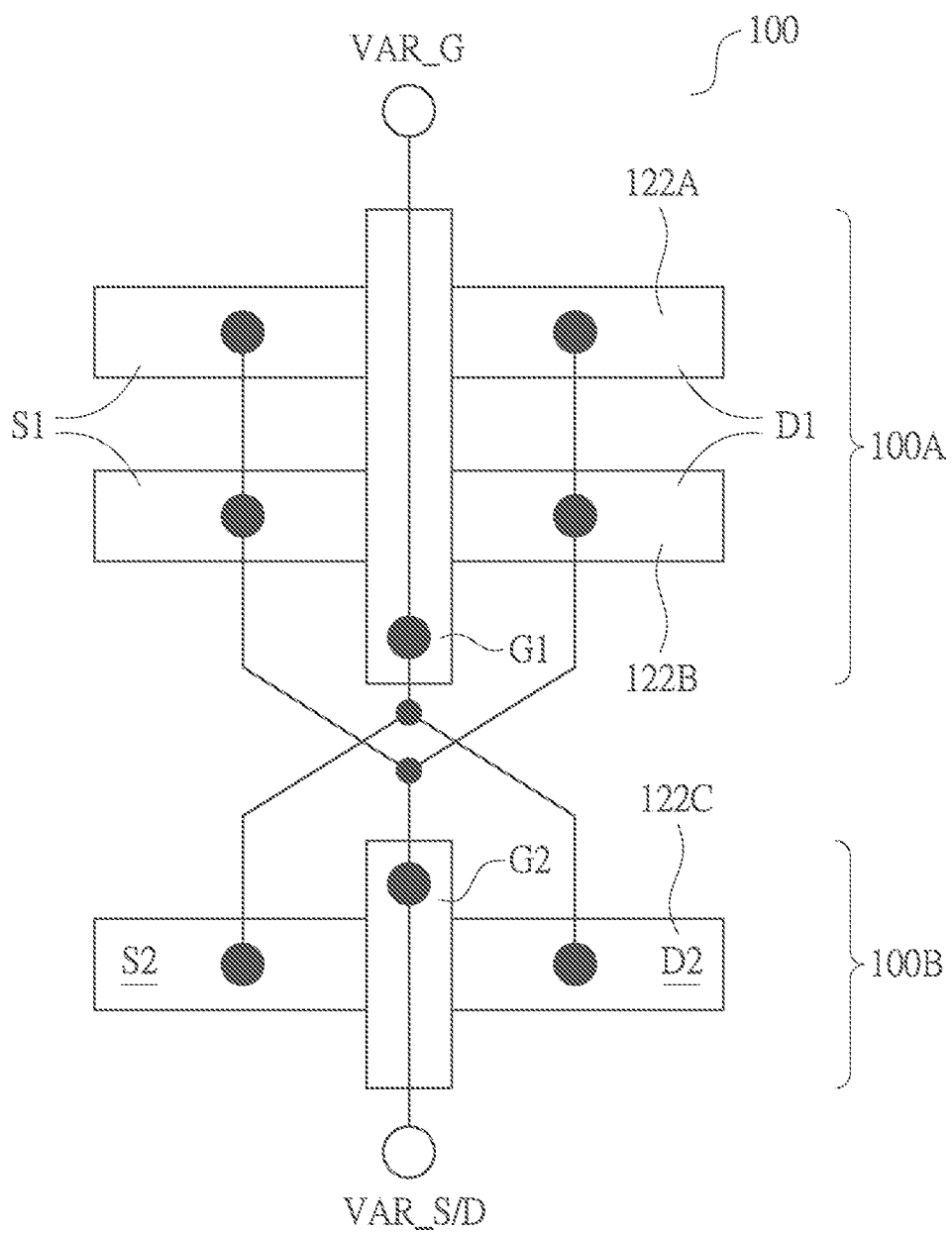

FIGS. 2A and 2B illustrate a perspective view and a top view, respectively, of varactor 100 in accordance with some embodiments. Varactor 100 also includes gates G1 and G2. Furthermore, varactor 100 includes fins 22 (including 22A, 22B, and 22C). Fins 22A and 22B form FinFET 100A with gate G1 and gate dielectrics 124A and 124B, and fin 22C forms FinFET 100B with gate G2 and gate dielectric 124C. The source S1 and drain D1 of FinFET 100A are interconnected, so that FinFET 100A forms a varactor, which is also denoted as 100A. The source S2 and drain D2 of FinFET 100B are interconnected, so that FinFET 100B forms a varactor, which is also denoted as 100B. In addition, gate G1 is connected to source S2 and drain region D2 to form one capacitor plate VAR_G of varactor 100, and gate G2 is connected to source S1 and drain region D1 to form the other capacitor plate VAR_S/D of varactor 100.

Source and drain regions S1, S2, D1, and D2 may be of the same conductivity type such as p-type or n-type. Each of varactors 100A and 100B may include any integer number of fins. In some embodiments, varactors 100A and 100B include different numbers of fins, as illustrated in FIGS. 2A and 2B. In alternative embodiments, varactors 100A and 100B include the same number of fins, wherein the fin number may be 1, 2, 3, 4, or more.

Figure 3A:
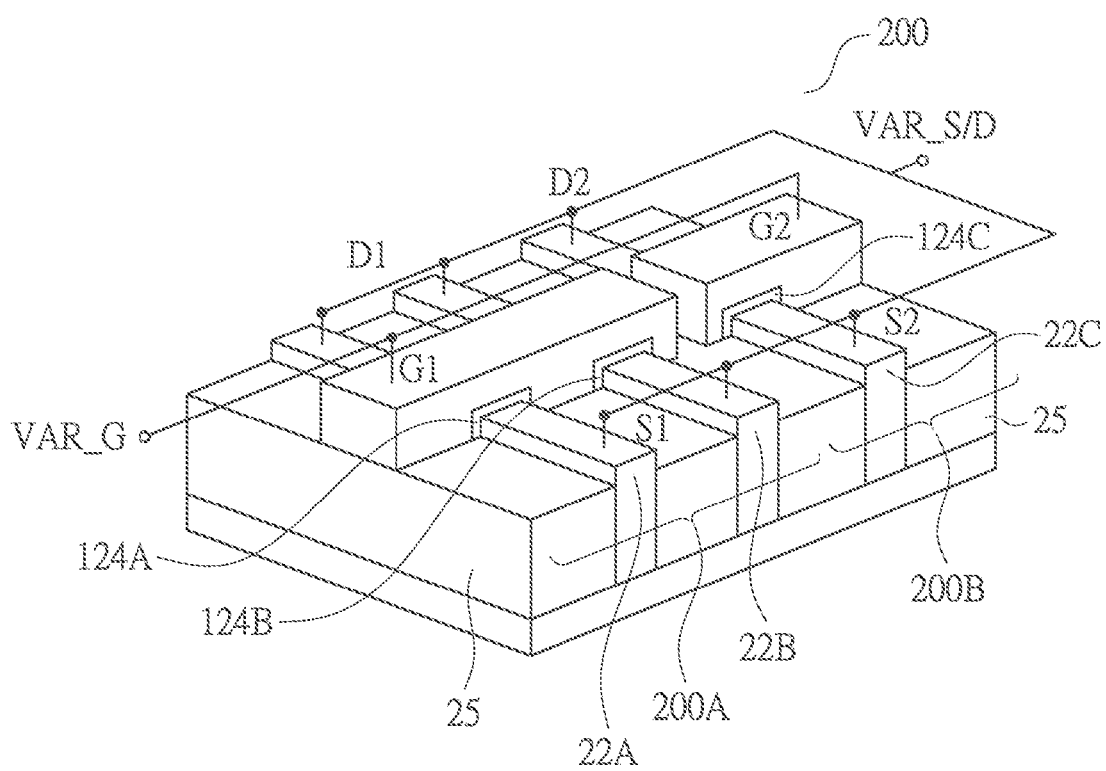
FIGS. 3A and 3B illustrate a perspective view and a top view, respectively, of a varactor in accordance with some embodiments, wherein the varactor includes two varactors connected in parallel.
Figure 3B:
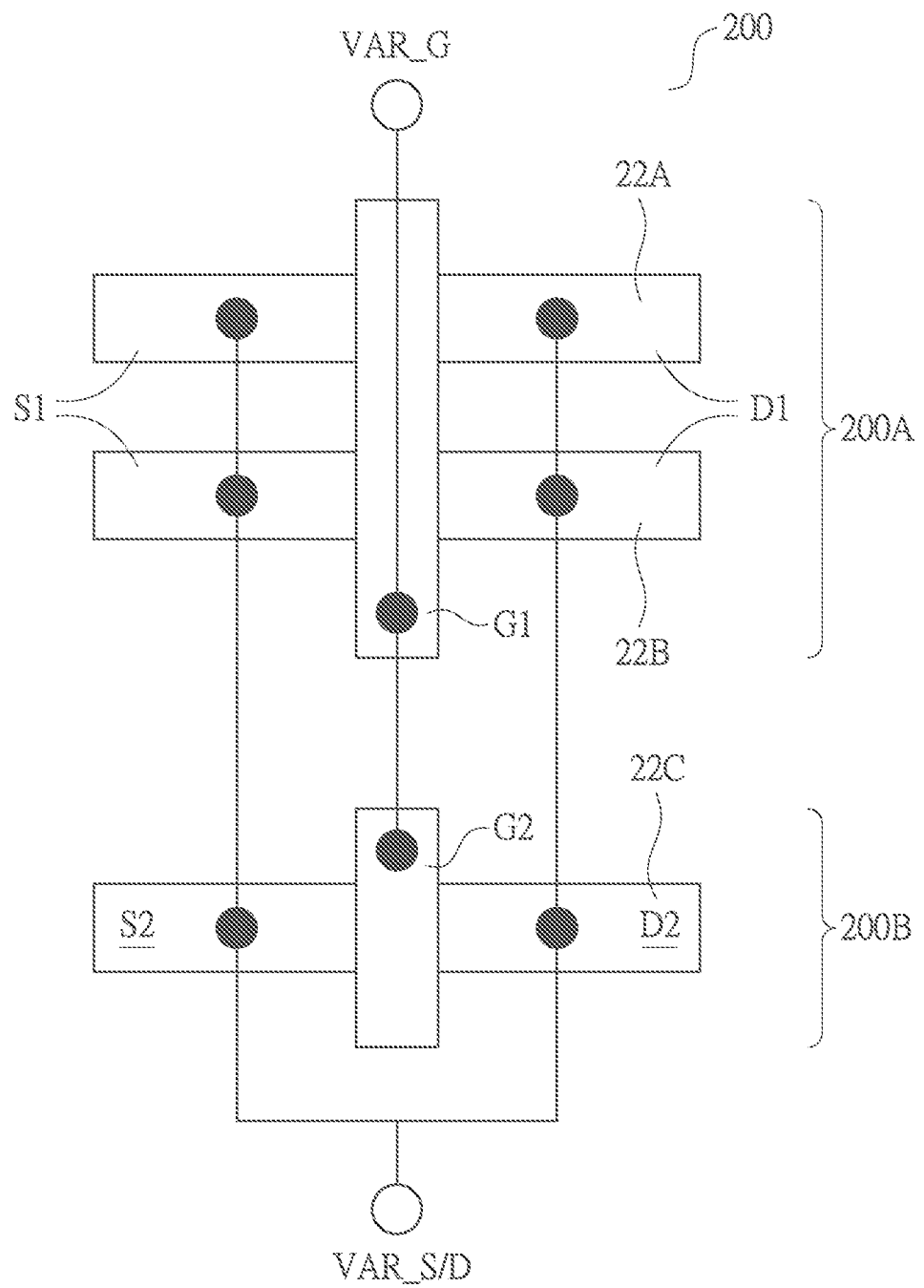

FIGS. 3A and 3B illustrate a perspective view and a top view, respectively, of varactor 200. Varactor 200 also includes gates G1 and G2. Furthermore, varactor 200 includes fins 22 (including 22A, 22B, and 22C). Fins 22A and 22B form FinFET 200A with gate G1 and gate dielectrics 124A and 124B, and fin 22C forms FinFET 200B with gate G2 and gate dielectric 124C. The source S1 and drain D1 of FinFET 200A are interconnected, so that FinFET 200A forms a varactor, which is also denoted as 200A. The source S2 and drain D2 of FinFET 200B are interconnected, so that FinFET 200B forms a varactor, which is also denoted as 200B. In addition, gates G1 and G2 are interconnected to form one capacitor plate VAR_G of varactor 200, and source S1 and drain D1 are connected to source S2 and drain D2 to form the other capacitor plate VAR_S/D of varactor 200.

In some embodiments, source and drain regions S1, S2, D1, and D2 are of the same conductivity type, which may be p-type or n-type. In alternative embodiments, source S1 and drain D1 may be of a conductivity type opposite to the conductivity type of source S2 and drain D2. For example, source S1 and drain D1 may be of p-type, while source S2 and drain D2 may be of n-type. Alternatively, source S1 and drain D1 are of n-type, while source S2 and drain D2 are of p-type. Each of varactors 100A and 100B may include any integer number of fins. In some embodiments, varactors 100A and 100B include different numbers of fins, as illustrated in FIGS. 3A and 3B. In alternative embodiments, varactors 100A and 100B include the same number of fins, wherein the number may be 1, 2, 3, 4, or more.

Figure 4A:
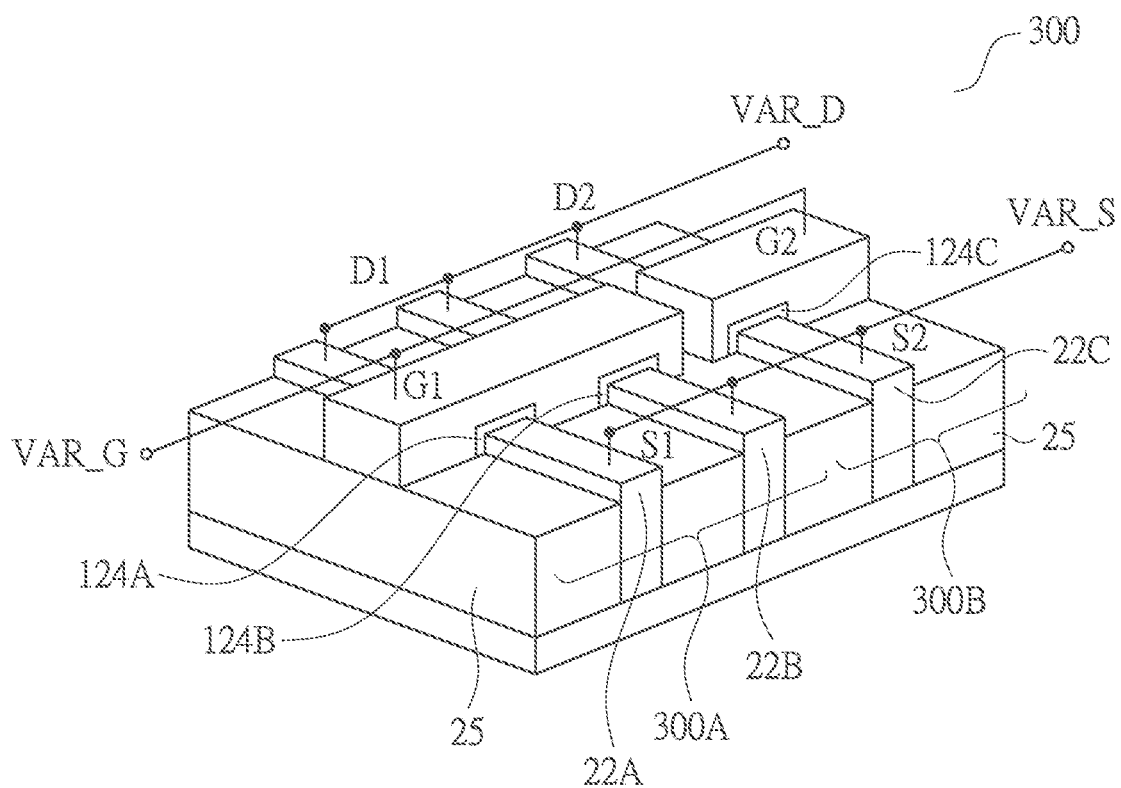
FIGS. 4A and 4B illustrate a perspective view and a top view, respectively, of a varactor in accordance with some embodiments, wherein the varactor includes two varactors connected in parallel, with the conductivity types of the source and drain regions of each of the two varactors being opposite to each other.
Figure 4B:
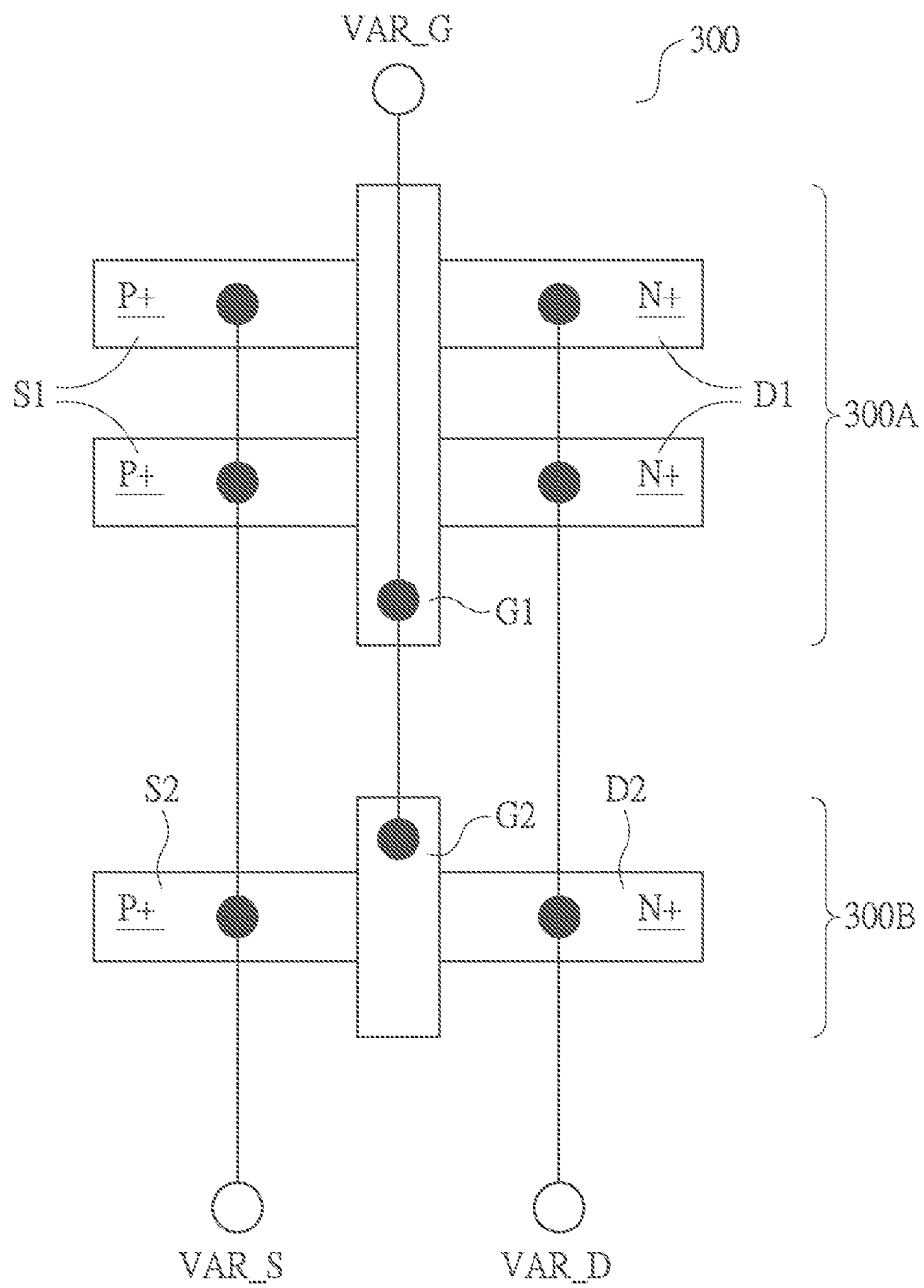

FIGS. 4A and 4B illustrate a perspective view and a top view, respectively, of varactor 300. Varactor 300 includes gates G1 and G2 that are interconnected to act as the capacitor plate VAR_G. Source S1 and drain D1 are connected to source S2 and drain D2 to form the other capacitor plate VAR_S/D of varactor 300. These embodiments are similar to the embodiments in FIGS. 2A and 2B, except that source regions S1 and S2 are of the same conductivity type, which is opposite to the conductivity type of drain regions D1 and D2. For example, source regions S1 and S2 may be of p-type, and drain regions D1 and D2 may be of n-type. Alternatively, source regions S1 and S2 may be of n-type, and drain regions D1 and D2 may be of p-type.

Figure 5:
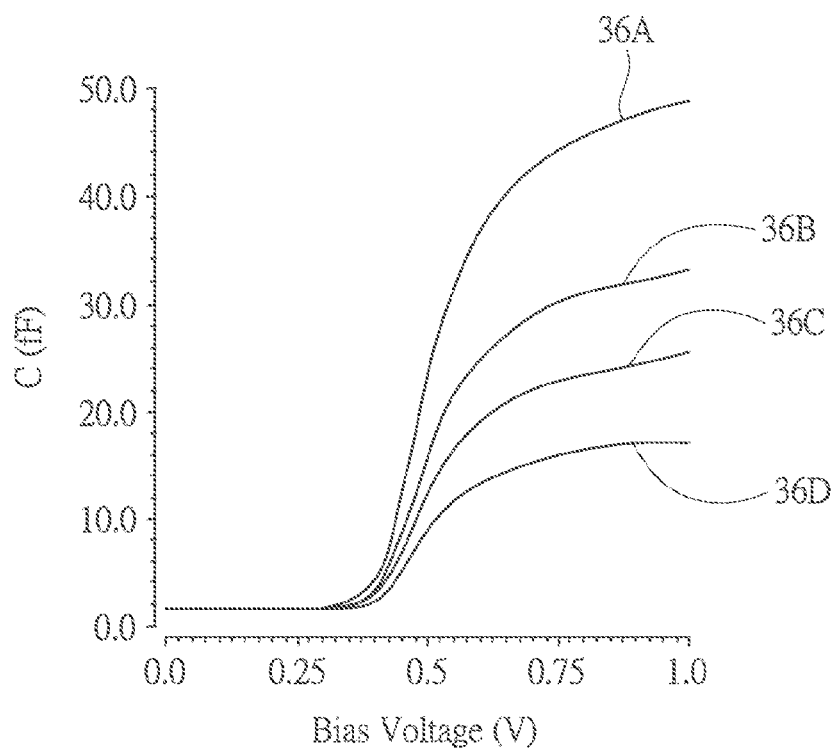
FIG. 5 illustrates the C-V curves of a plurality of varactors in accordance with some embodiments.

In accordance with some embodiments, as shown in the exemplary FIGS. 2A, 2B, 3A, 3B, 4A, and 4B, the size of the first varactor (100A/200A/300A) is different from the size of the second varactor (100B/200B/300B). This may be achieved, for example, by making the number of fins in the first varactor (100A/200A/300A) to be different from the number of fins in the second varactor (100B/200B/300B). With the numbers of fins in the two varactors being different from each other, the capacitance sensitivity of the respective varactor may be reduced. Furthermore, by adjusting the ratio of the numbers of fins in the two varactors, the capacitance sensitivity of the respective varactor may be adjusted to a desirable value. FIG. 5 illustrates the C-V curve of some exemplary varactors, wherein the capacitance of varactor 20 is illustrated as a function of bias voltage, which is the voltage applied on the two interconnected gates of the two varactors. The results may be obtained from the varactors having structures similar to what are shown in FIGS. 3A and 3B, wherein each of lines 36A, 36B, 36C, and 36D is generated from a varactor. Varactors 100B/200B/300B and 100A/200A/300A for generating each of lines 36A, 36B, 36C, and 36D include an n-type FinFET and a p-type FinFET, respectively. Lines 36A, 36B, 36C, and 36D are obtained from varactors that have different Fin Number Ratios (FNRs). FNR represents the ratio of the number of fins in varactor 100B/200B/300B to the number of fins in the respective varactor 100A/200A/300A (FIGS. 3A and 3B). In each of the varactors whose C-V curves are shown as lines 36A, 36B, 36C, and 36D, the total numbers of fins of varactors 100B/200B/300B and 100A/200A/300A is equal to 24. Line 36A is obtained when the FNR is (1:0), and hence varactor 100B/200B/300B includes 24 fins, and 100A/200A/300A includes no fin, which means that no varactor is parallel connected to varactor 100B/200B/300B. Lines 36B, 36C, and 36D are obtained when the FNRs are adjusted to (2:1), (1:1), and (1:2), respectively. It is observed that with the change of FNR, the capacitance values are reduced, and the capacitance sensitivity is also reduced, as clearly observed from the less steep lines 36B, 36C, and 36D. Furthermore, by comparing the capacitance values of lines 36A, 36B, and 36C with line 36A, it is observed that the actual capacitances of the varactors are proportional to the FNRs.

Figure 6:
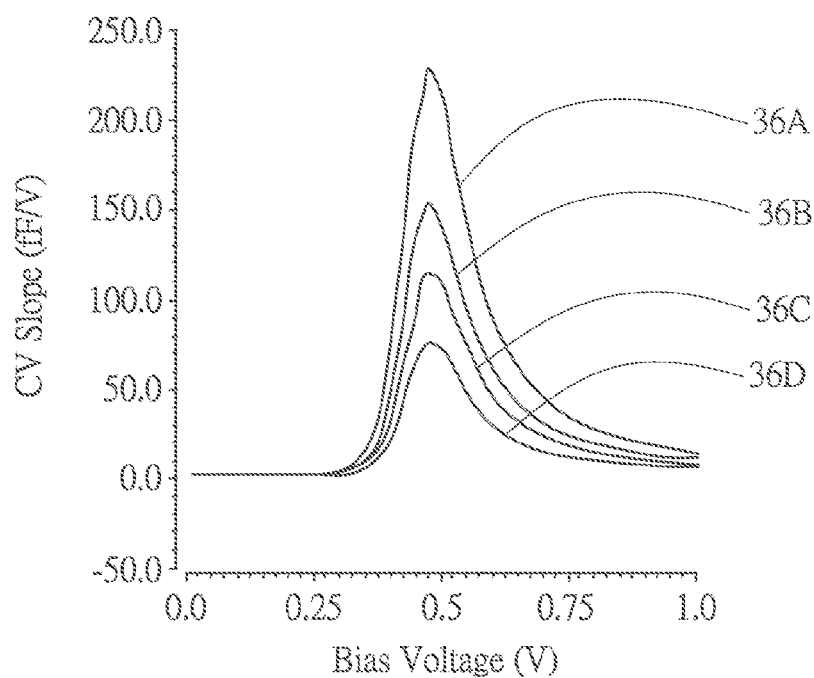
FIG. 6 illustrates the slopes of the capacitance of the plurality of varactors as functions of bias voltages.

FIG. 6 illustrates the capacitance slope (calculated from FIG. 5) as a function of bias voltage, wherein the slope is the capacitance sensitivity. The slope is calculated as the ratio of the change in the capacitance to the change in bias voltage. It is clearly illustrated that with the FNR is reduced (with line 36A having the highest FNR, and line 36D having the lowest FNR), the capacitance sensitivity is also reduced.

In the above discussion, although FNRs equal to or smaller than 1 are used as examples, when FNRs are equal to or greater than 1, the same results may be obtained, wherein by enlarging the difference between the numbers of fins in the two interconnected varactors, the capacitance sensitivity of the resulting varactor may be reduced, regardless of which one of the interconnected varactors has more fins.

FIGS. 7 through 16 illustrate the variations of the varactors in accordance with the embodiments of the present disclosure. Please note that in each of FIGS. 7 through 16, the conductivity types of the plurality of FinFETs may be the same as each other, or may be opposite to each other. The various components in FIGS. 7 through 15 such as the gate dielectrics (between gates and the respective fins) are not discussed in detail herein while they are illustrated.

Figure 7:
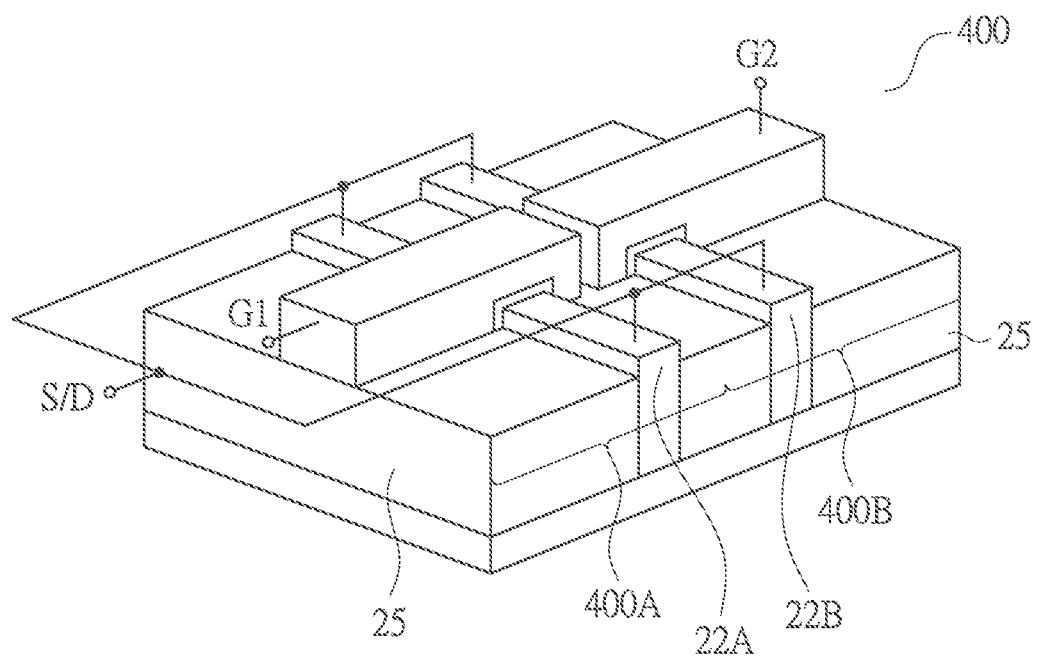
FIGS. 7 through 16 illustrate the perspective views of varactors in accordance with some exemplary embodiments.

FIG. 7 illustrates a one-finger-two-fin varactor 400. Varactor 400 includes gates G1 and G2 that are aligned to a straight line, hence forming a finger. Fins 22A and 22B are parallel to each other, and form varactors 400A and 400B with gates G1 and G2, respectively. The source and drain regions S/D of varactors 400 are interconnected, while gates G1 and G2 are disconnected from each other. In these embodiments, gate G1 does not form any FinFET and any varactor with fin 22B, and gate G2 does not form any FinFET and any varactor with fin 22A.

Figure 8:
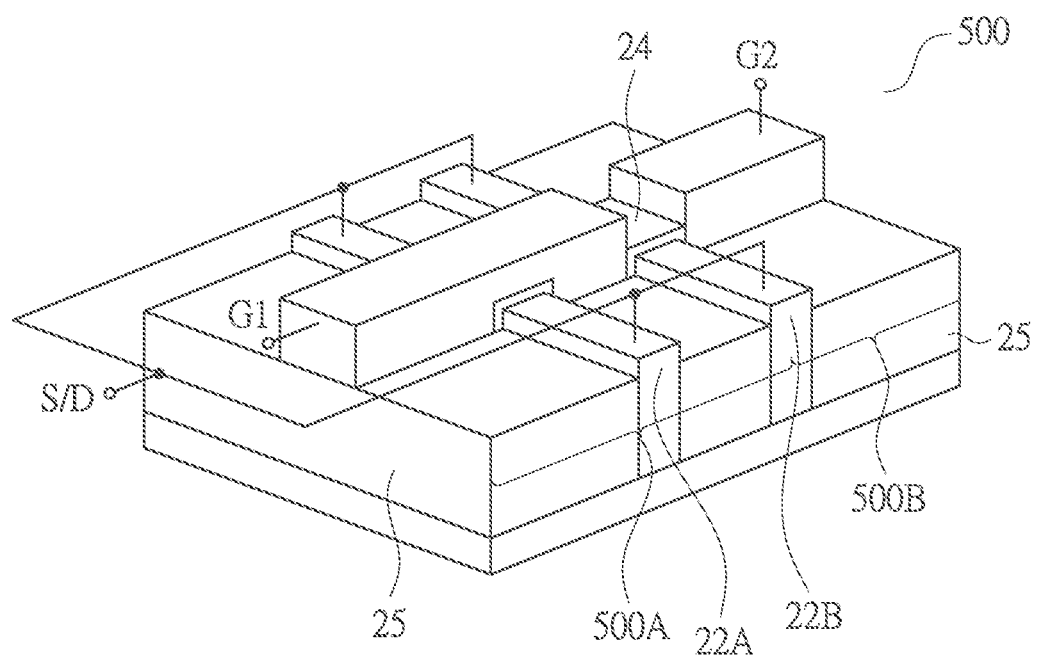

FIG. 8 illustrates one-finger-two-fin varactor 500, which is similar to varactor 400 in FIG. 7. In these embodiments, fins 22A and 22B are parallel to each other, and form varactors 500A and 500B with gates G1 and G2, respectively. In addition, gate G1 extends to contact a sidewall portion of gate dielectric 24, and hence also forms a FinFET (which is also a varactor) with fin 22B. The remaining portions are essentially the same as in FIG. 7.

Figure 9:
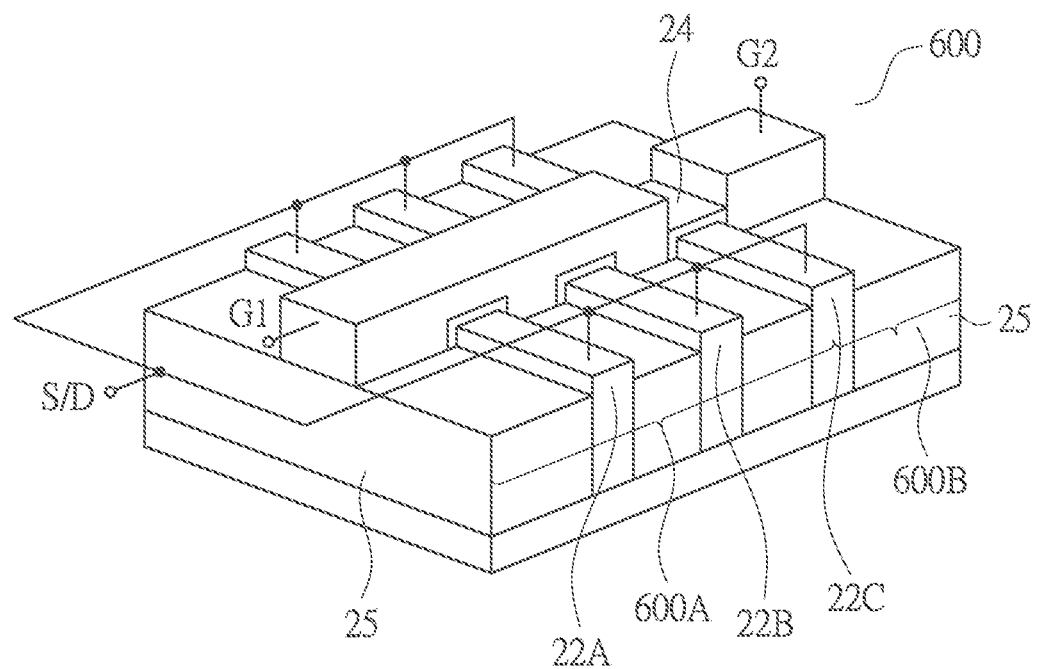

FIG. 9 illustrates varactor 600, which is a one-finger-three-fin varactor including gates G1 and G2 that are aligned to a straight line, hence forming a finger. Fins 22A and 22B are parallel to each other, and form varactors 600A with gate G1. Gate G2 forms varactor 600B with a sidewall portion of gate dielectric 24. The source and drain regions of varactors 600 are interconnected, while gates G1 and G2 are physical disconnected from each other, and may be, or may not be, electrically disconnected from each other. In these embodiments, gate G1 forms a FinFET (which is also a varactor) with fin 22C, and gate G2 does not form any FinFET and any varactor with fins 22A and 22B.

Figure 10:
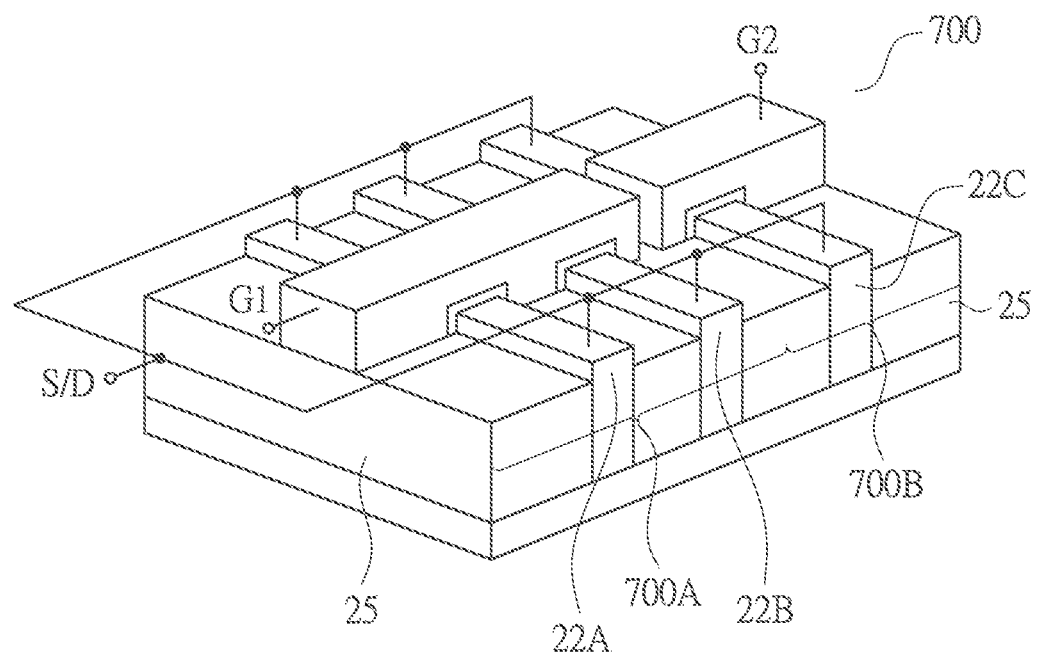

FIG. 10 illustrates a one-finger-three-fin varactor 700, which includes gates G1 and G2 that are aligned to a straight line, hence forming a finger. Fins 22A and 22B are parallel to each other, and form varactor 700A with gate G1. Fin 22C forms varactor 700B with gate G2. The source and drain regions of varactors 700 are interconnected, while gates G1 and G2 are physically and electrically disconnected from each other. In these embodiments, gate G1 does not form any FinFET and any varactor with fin 22C, and gate G2 does not form any FinFET and any varactor with fins 22A and 22B.

Figure 11:
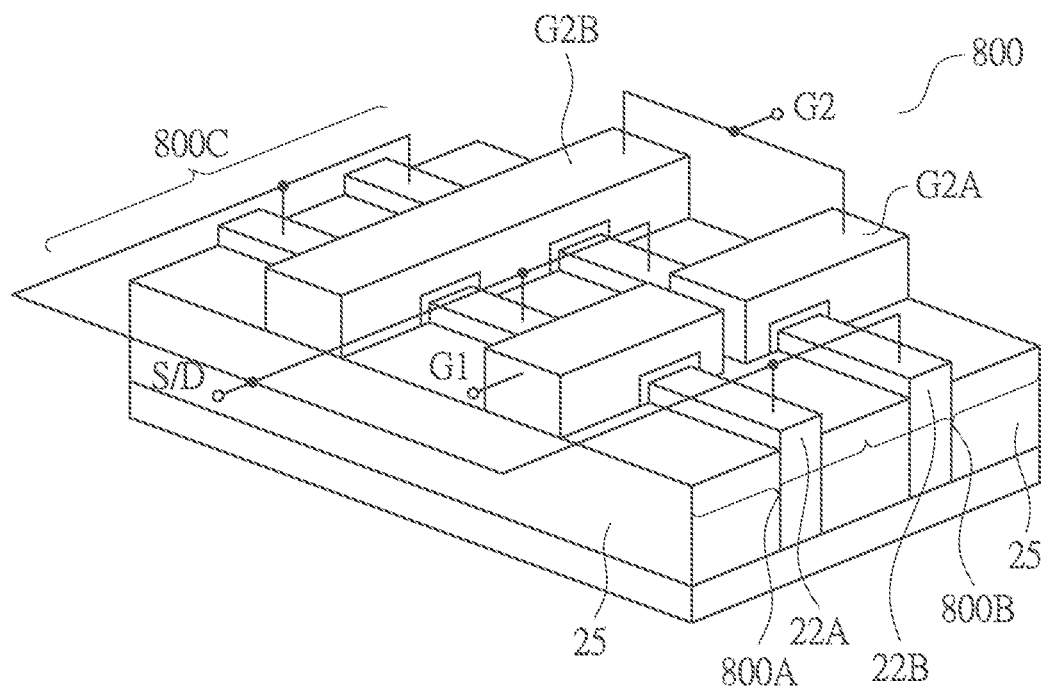

FIG. 11 illustrates a two-finger-two-fin varactor 800, which includes interconnected varactors 800A, 800B, and 800C. Varactor 800 includes gates G1 and G2A that are aligned to a straight line, hence forming a finger. Gate G2B forms another finger, which is not aligned to the same straight line that gates G1 and G2A are aligned to. Gates G2A and G2B are interconnected to form gate G2 of the respective varactor 800. Gates G1, G2A, and G2B may be parallel to each other. Fins 22A and 22B are parallel to each other, and form varactor 800C with gate G2B. Fin 22A further forms varactor 800A with gate G1. Fin 22B further forms varactor 800B with gate G2A. The source and drain regions of varactors 800A, 800B, and 800C are interconnected as node S/D, while gates G1 and G2 are disconnected from each other.

Figure 12:
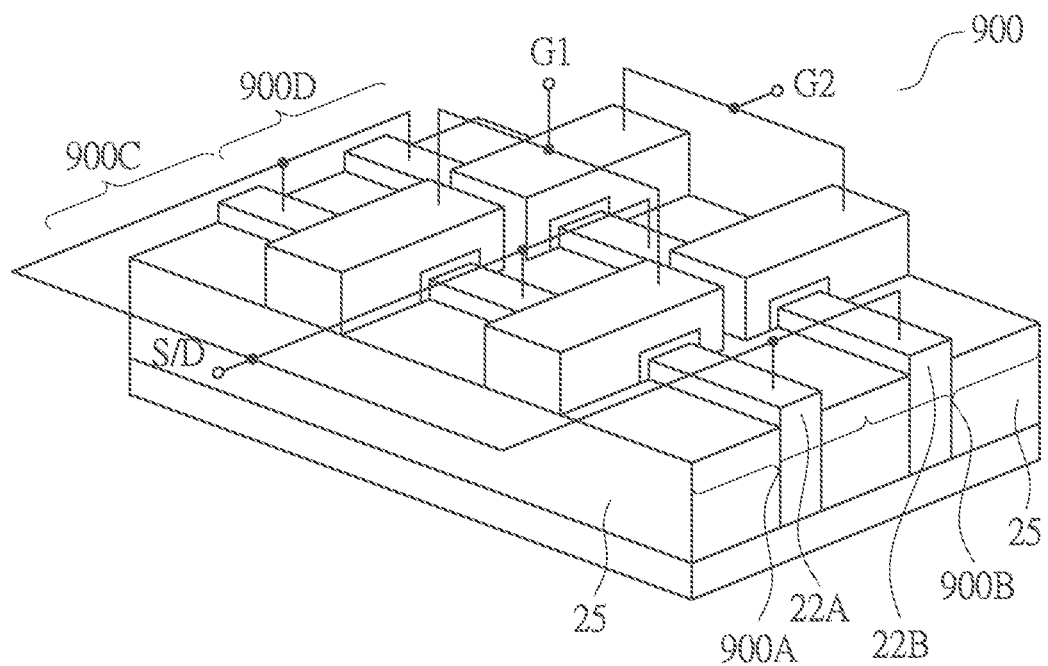

FIG. 12 illustrates a two-finger-two-fin varactor 900, which includes interconnected varactors 900A, 900B, 900C, and 900D. FIG. 12 is similar to FIG. 11, except that each of gates G1 and G2 includes two physically separated and electrically interconnected gates, which form varactors with fins 22A and 22B.

Figure 13:
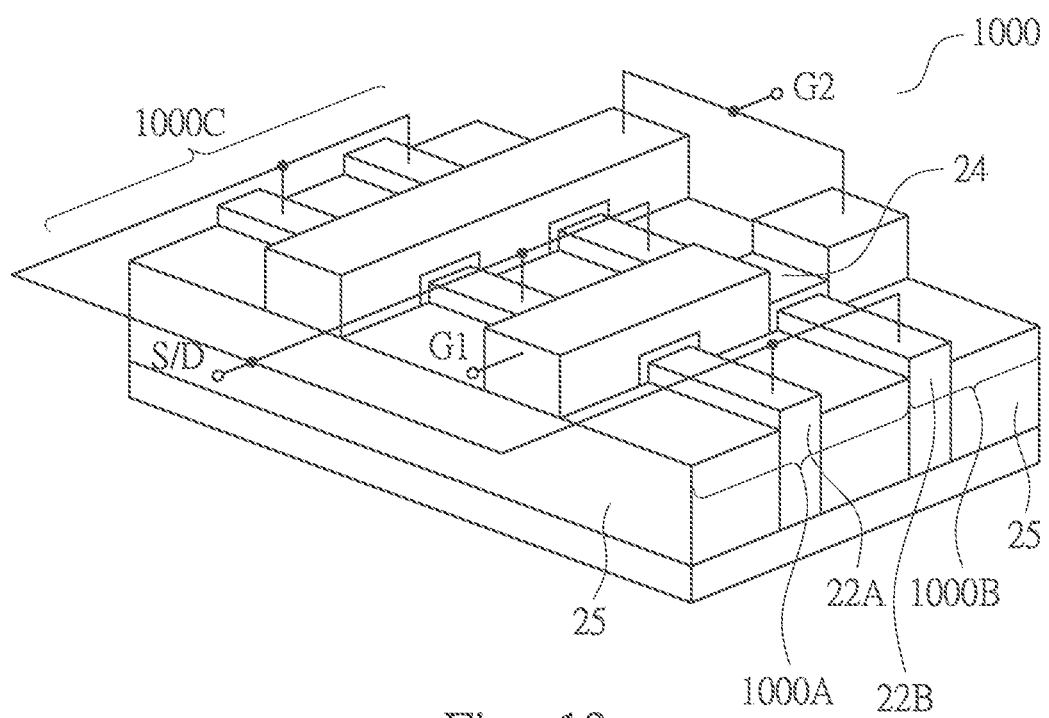

FIG. 13 also illustrates a two-finger-two-fin varactor 1000, which includes interconnected varactors 1000A, 1000B, and 1000C. Varactor 1000 is similar to the varactor in FIG. 11, except that gate G1 extends to the sidewall of gate dielectric 24 to form another varactor. Besides, gate G1 also forms a FinFET (which is also a varactor) with the sidewalls and the top surface of fin 22A. Gate G2 forms a varactor with a sidewall portion of gate dielectric 24.

Figure 14:
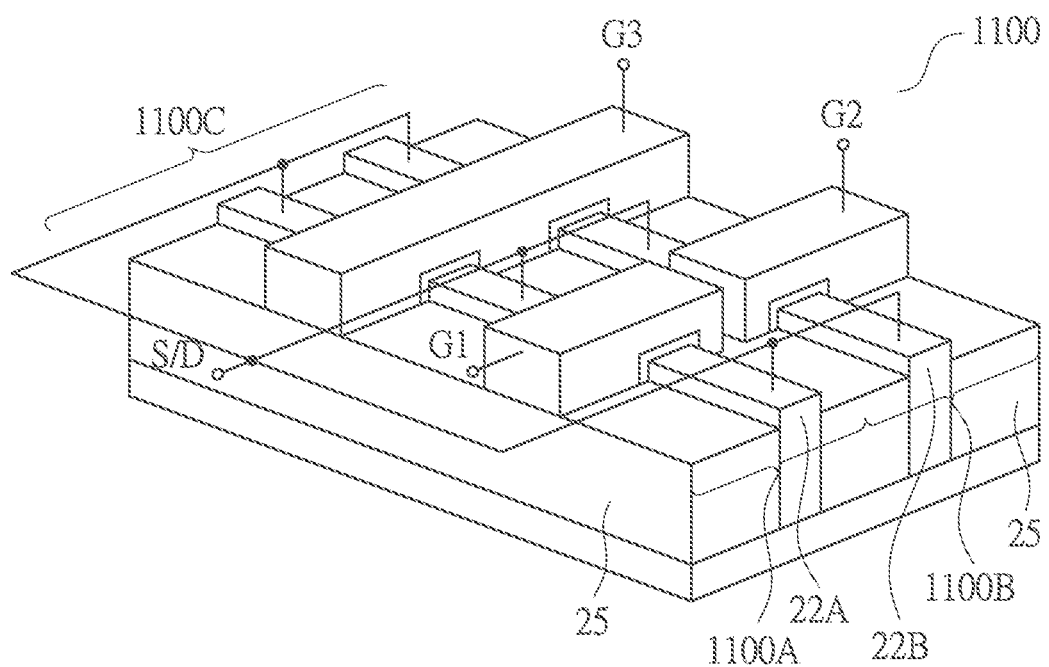

FIG. 14 illustrates a three-gate varactor 1100, which includes interconnected varactors 1100A, 1100B, and 1100C. Varactor 1100 is also a two-finger-two-fin varactor. In accordance with some embodiments, gates G1 and G2 form one finger. Gate G3 forms another finger. Gates G1, G2, and G3 are physically and electrically disconnected from each other, so that different voltages may be applied on gates G1, G2, and G3 at the same time. The respective varactor 1100 is hence a four-terminal varactor.

Figure 15:
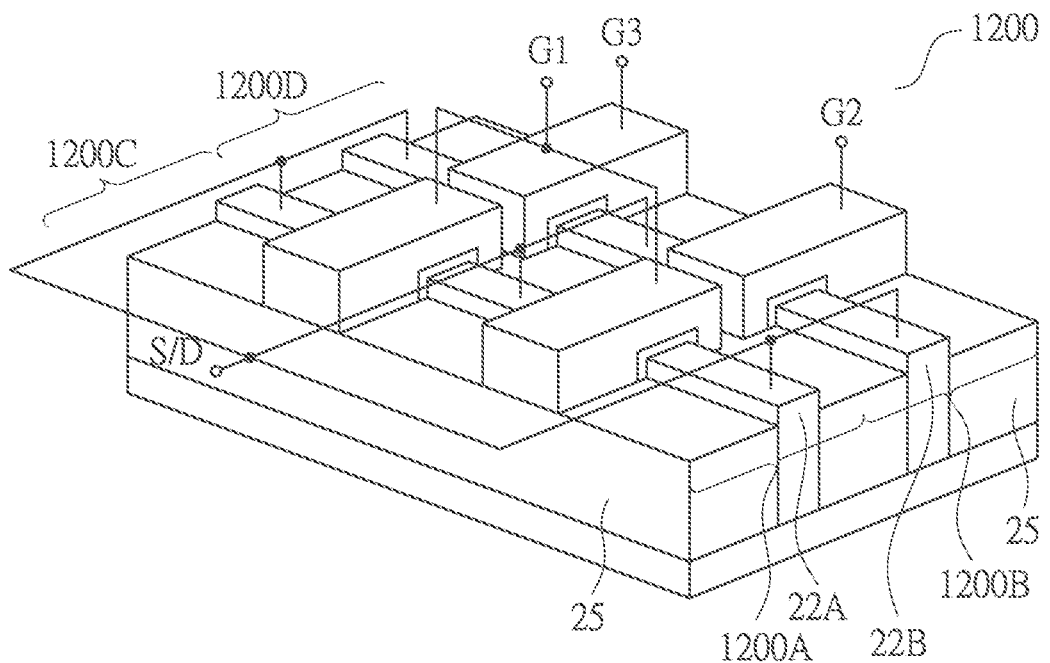

FIG. 15 illustrates a four-gate varactor 1200, which includes interconnected varactors 1200A, 1200B, 1200C, and 1200D. These embodiments are similar to the embodiments in FIG. 14, except that gate G1 of varactor 1200 includes portions in two fingers. The gates of varactors 1200A, 1200B, 1200C, and 1200D are physically disconnected from each other. The gates of varactors 1200A and 1200C are interconnected to form gate G1. The gate G2 of varactor 1200B and gate G3 of varactor 1200D are electrically disconnected from gates G1, and are electrically disconnected from each other.

Figure 16:
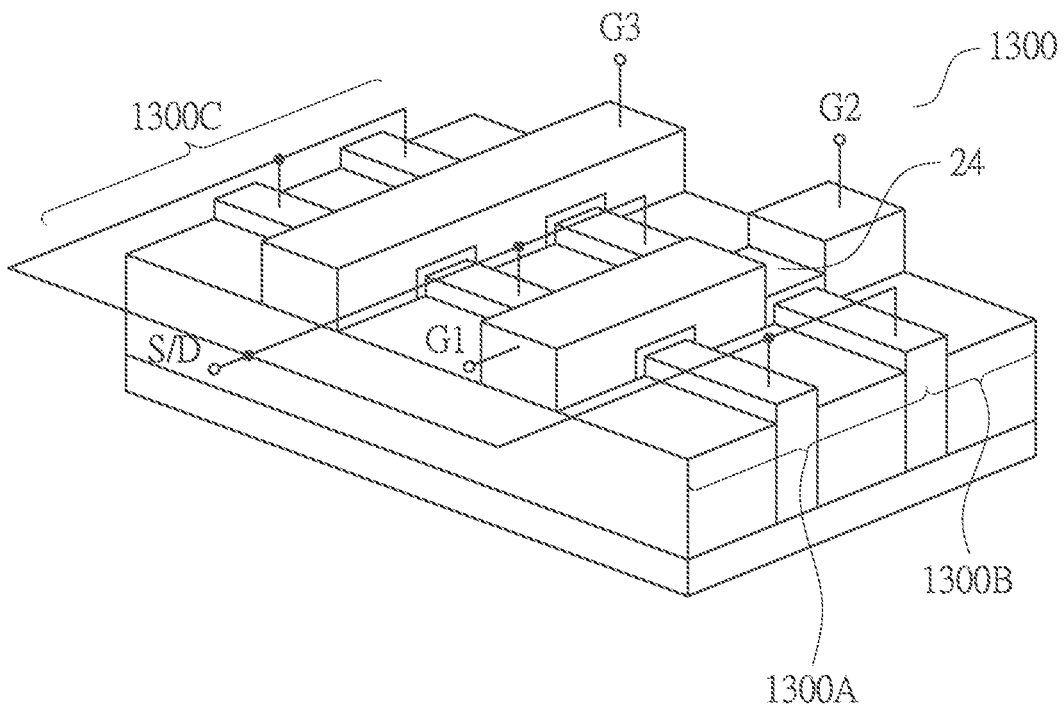

FIG. 16 illustrates a three-gate varactor 1300, which includes interconnected varactors 1300A, 1300B, and 1300C including gates G1, G2, and G3, respectively. These embodiments are similar to the embodiments in FIG. 14, except that gate G1 of varactor 1300 extends to the sidewall of gate dielectric 24 to form another varactor.

In accordance with embodiments of the present disclosure, by forming varactors that include multiple gates and/or multiple fins, the capacitance sensitivity of the varactors may be reduced. In addition, better Q factor may be achieved. The embodiments of the present disclosure are compatible with FinFET formation processes, and there is no additional process steps required.

In accordance with some embodiments, a varactor includes at least one semiconductor fin, a first gate, and a second gate physically disconnected from the first gate. The first gate and the second gate form a first FinFET and a second FinFET, respectively, with the at least one semiconductor fin. The source and drain regions of the first FinFET and the second FinFET are interconnected to form the varactor.

In accordance with other embodiments, a varactor includes a first semiconductor fin, and a gate dielectric, which includes a first sidewall portion on a first sidewall of the first semiconductor fin, and a second sidewall portion on a second sidewall of the first semiconductor fin. The varactor further includes a first gate in contact with the first sidewall portion of the gate dielectric, and a second gate in contact with the second sidewall portion of the gate dielectric. The first gate, the first sidewall portion of the gate dielectric, and the first sidewall of the first semiconductor fin form portions of a first varactor. The second gate is physically disconnected from the first gate. The second gate, the second sidewall portion of the gate dielectric, and the second sidewall of the first semiconductor fin form portions of a second varactor. A source and a drain region are on opposite ends of the gate dielectric, wherein the source and the drain regions are interconnected to form the first varactor and the second varactor.

In accordance with yet other embodiments, a varactor includes a first FinFET and a second FinFET connected to the first FinFET to form the varactor. The first FinFET includes a plurality of semiconductor fins, a first gate over the plurality of semiconductor fins, and a first source and a first drain comprising end portions of the plurality of semiconductor fins. The first source is electrically connected to the first drain. The second FinFET includes at least one semiconductor fin, a second gate over the at least one semiconductor fin, and a second source and a second drain comprising end portions of the at least one semiconductor fin. The second source is electrically connected to the second drain. A total number of fins in the first FinFET is greater than a total number of fins in the second FinFET.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A varactor comprising:
   at least one semiconductor fin;
   a first gate; and
   a second gate physically disconnected from the first gate, wherein the first gate and the second gate form a first FinFET and a second FinFET, respectively, with the at least one semiconductor fin, and wherein source and drain regions of the first FinFET and the second FinFET are constantly electrically shorted with each other to form the varactor.

2. The varactor of claim 1, wherein first FinFET and the second FinFET do not share fins.

3. The varactor of claim 1, wherein the first FinFET and the second FinFET comprise a same fin.

4. The varactor of claim 1, wherein the first gate is connected to a second source and a second drain of the second FinFET, and wherein the second gate is connected to a first source and a first drain of the first FinFET.

5. The varactor of claim 1, wherein the at least one semiconductor fin comprises a semiconductor fin, wherein the first gate forms the first FinFET with a first sidewall portion of the semiconductor fin, and wherein the second gate forms the second FinFET with a second sidewall portion of the semiconductor fin.

6. The varactor of claim 5, wherein the first gate and the second gate are electrically decoupled from each other, and the varactor further comprises a gate dielectric comprising:
   a first sidewall portion between and in physical contact with both the first gate and the first sidewall portion of the semiconductor fin; and
   a second sidewall portion between and in physical contact with both the second gate and the second sidewall portion of the semiconductor fin.

7. The varactor of claim 6, wherein the gate dielectric further comprises a top portion connecting the first sidewall portion of the gate dielectric to the second sidewall portion of the gate dielectric.

8. A varactor comprising:
   a first semiconductor fin;
   a first gate dielectric comprising:
      a first sidewall portion on a first sidewall of the first semiconductor fin; and
      a second sidewall portion on a second sidewall of the first semiconductor fin;
   a first gate in contact with the first sidewall portion of the first gate dielectric, wherein the first gate, the first sidewall portion of the first gate dielectric, and the first sidewall of the first semiconductor fin form portions of a first varactor; and
   a second gate in contact with the second sidewall portion of the first gate dielectric, wherein the second gate is physically disconnected from the first gate, and wherein the second gate, the second sidewall portion of the first gate dielectric, and the second sidewall of the first semiconductor fin form portions of a second varactor; and
   a source and a drain region on opposite ends of the first gate dielectric, wherein the source and the drain regions are interconnected to form the first varactor and the second varactor.

9. The varactor of claim 8, wherein the first gate and the second gate are electrically disconnected from each other.

10. The varactor of claim 8 further comprising:
    a second semiconductor fin parallel to the first semiconductor fin; and
    a second gate dielectric on sidewalls and a top surface of the second semiconductor fin, wherein the first gate further extends over the second gate dielectric.

11. The varactor of claim 8, wherein the first gate dielectric further comprises a top surface portion overlapping the first semiconductor fin, and wherein the first gate and the second gate does not overlap the top surface portion.

12. A varactor comprising:
    a first FinFET comprising:
       a plurality of semiconductor fins;
       a first gate over the plurality of semiconductor fins; and
       a first source and a first drain comprising end portions of the plurality of semiconductor fins, wherein the first source is electrically connected to the first drain; and
    a second FinFET connected to the first FinFET to form the varactor, wherein the second FinFET comprises:
       at least one semiconductor fin;
       a second gate over the at least one semiconductor fin; and
       a second source and a second drain comprising end portions of the at least one semiconductor fin, wherein the second source is electrically connected to the second drain, and wherein a first total number of fins in the first FinFET is greater than a second total number of fins in the second FinFET.

13. The varactor of claim 12, wherein the first gate is connected to the second source and the second drain, and wherein the second gate is connected to the first source and the first drain.

14. The varactor of claim 13, wherein the first source, the first drain, the second source, and the second drain are of a same conductivity type.

15. The varactor of claim 12, wherein the first gate is connected to the second gate, and wherein the first source, the first drain, the second source, and the second drain are interconnected.

16. The varactor of claim 15, wherein the first source and the first drain are of a first conductivity type, and wherein the second source and the second drain are of a second conductivity type opposite to the first conductivity type.

17. The varactor of claim 15, wherein the first source and the second source are of a first conductivity type, and wherein the first drain and second drain are of a second conductivity type opposite to the first conductivity type.

* * * * *